United States Patent
Squires (10) Patent No.: US 9,934,871 B2
(45) Date of Patent: Apr. 3, 2018

(54) VERIFICATION OF STORAGE MEDIA UPON DEPLOYMENT

(71) Applicant: HGST Netherlands B.V., Amsterdam (NL)

(72) Inventor: Christopher Squires, Boulder, CO (US)

(73) Assignee: Western Digital Technologies, Inc., Irvine, CA (US)

(*) Notice: Subject to any disclaimer, the term of this patent is extended or adjusted under 35 U.S.C. 154(b) by 2 days.

(21) Appl. No.: 14/689,770

(22) Filed: Apr. 17, 2015

(65) Prior Publication Data
US 2016/0307646 A1 Oct. 20, 2016

(51) Int. Cl.
| | | |
|---|---|---|
| G11C 29/00 | (2006.01) | |
| G11C 29/48 | (2006.01) | |
| G06F 3/06 | (2006.01) | |
| G11C 29/44 | (2006.01) | |
| G11C 29/04 | (2006.01) | |

(52) U.S. Cl.
CPC .............. G11C 29/48 (2013.01); G06F 3/068 (2013.01); G06F 3/0619 (2013.01); G06F 3/0644 (2013.01); G11C 29/44 (2013.01); G11C 2029/0401 (2013.01)

(58) Field of Classification Search
CPC ....... G11C 29/48; G06F 3/068; G06F 3/0644; G06F 3/0619
See application file for complete search history.

(56) References Cited

U.S. PATENT DOCUMENTS

| | | | |
|---|---|---|---|
| 5,828,583 A | 10/1998 | Bush et al. | |
| 6,289,484 B1 | 9/2001 | Rothberg et al. | |
| 6,950,967 B1 | 9/2005 | Brunnett et al. | |
| 7,139,145 B1 | 11/2006 | Archibald et al. | |
| 7,620,772 B1 | 11/2009 | Liikanen et al. | |
| 7,929,234 B1 | 4/2011 | Boyle et al. | |
| 8,004,785 B1 | 8/2011 | Tsai et al. | |
| 8,599,507 B2 | 12/2013 | Sanvido et al. | |
| 2003/0061263 A1* | 3/2003 | Riddle | H04L 29/06 718/104 |
| 2008/0189560 A1* | 8/2008 | Case | G06F 12/1458 713/193 |

(Continued)

OTHER PUBLICATIONS

Evans, Mark. "Hard Drive Self-Tests." Quantum Corporation. Apr. 26, 1999.

*Primary Examiner* — Thien D Nguyen (57) ABSTRACT

Described here in are systems, methods and, software to verify storage media and storage subsystems upon deployment. In one example, a computer apparatus to test storage media in a storage subsystem includes processing instructions that direct a computing system to identify initiation of a storage subsystem, initiate a testing process of the storage media, and identify a partition availability event for the storage media. The processing instructions also direct the computing system to, in response to the partition availability event, make a partition of the storage media available to a host processing system, wherein the partition comprises storage locations in the storage media tested via the testing process, and continue the testing process on the storage media. The computer apparatus also includes one or more non-transitory computer readable media that store the processing instructions.

20 Claims, 6 Drawing Sheets

(56) References Cited

U.S. PATENT DOCUMENTS

| | | | |
|---|---|---|---|
| 2009/0083580 A1* | 3/2009 | Postage | G06F 11/2221 714/34 |
| 2010/0121855 A1* | 5/2010 | Dalia | G06F 15/16 707/741 |
| 2010/0274877 A1* | 10/2010 | Goetz | G06F 8/61 709/222 |
| 2013/0179880 A1* | 7/2013 | Edholm | G06F 9/45558 718/1 |
| 2014/0122924 A1* | 5/2014 | Kazi | H04L 67/1097 714/6.22 |
| 2014/0181455 A1* | 6/2014 | Wang | G06F 3/0608 711/171 |
| 2015/0220385 A1* | 8/2015 | Wood | G06F 11/108 714/6.24 |
| 2015/0227437 A1* | 8/2015 | Eidelman | G06F 11/1456 714/6.23 |

* cited by examiner

VERIFICATION OF STORAGE MEDIA UPON DEPLOYMENT

TECHNICAL BACKGROUND

Storage subsystems, such as hard disk drives and solid state drives, provide storage media for host processing systems to store and read various data objects. These data objects may include images, videos, word documents, spreadsheets, and various other file types capable of being processed by the host processing system. To make storage media available to the host system, one or more of the subsystems may be communicatively coupled to the system using a Small Computer System Interface (SCSI) bus, a Serial Attached SCSI (SAS) bus, a Serial ATA (SATA) bus, a Peripheral Component Interconnect Express (PCIe) bus, Fibre Channel, or some other similar interface or bus.

Prior to communicatively coupling the storage subsystem to the host processing system, regions within the subsystem may be tested or verified at the manufacturer to ensure that regions are available to the user at the end computing system. Accordingly, any segment or portion of the subsystem that would be unable to store data would not be visible to the user when the subsystem is coupled. However, as drive size and the number of drives produced by the manufacturer has increased, it has become more inefficient to test and verify portions within the subsystems before providing the drive to the end user.

OVERVIEW

Examples disclosed herein provide systems, methods, and software to test storage media and storage subsystems upon deployment. In one example, a computer apparatus to test a storage subsystem for a host processing system includes one or more non-transitory computer readable media, and processing instructions stored on the one or more non-transitory computer readable media that direct a processing system to, when deploying the storage subsystem that comprises storage media, initiate a testing process to identify storage blocks in the storage media suitable for storing data for the host processing system. The processing instructions further direct the processing system to, after initiating the testing process, iteratively identify partition availability events. The processing instructions also direct the processing system to, in response to each partition availability event in the partition availability events, make a partition of the storage media available to the host processing system, wherein the partition comprises a collection of storage blocks tested via the testing process and distinct from other storage blocks in partitions previously made available to the host processing system In another instance, a storage subsystem to test storage media upon deployment includes storage media, and a storage processing system configured to, when deploying the storage subsystem in a computing system with a host processing system, initiate a testing process to identify storage blocks in the storage media suitable for storing data for the host processing system. The storage processing system is further configured to, after initiating the testing process, iteratively identify partition availability events. The storage processing system is further configured to, in response to each partition availability event in the partition availability events, make a partition of the storage media available to the host processing system, wherein the partition comprises a collection of storage blocks tested via the testing process and distinct from other storage blocks in partitions previously made available to the host processing system In a further example, a host computing system includes a host processing system, and a storage subsystem comprising storage media and a storage processing system, wherein the storage processing system is configured to, when deploying the storage subsystem in the computing system, initiate a testing process to identify storage blocks in the storage media suitable for storing data for the host processing system. The storage processing system is further configured to, after initiating the testing process, iteratively identify partition availability events. The storage processing system is also configured to, in response to each partition availability event in the partition availability events, make a partition of the storage media available to the host processing system, wherein the partition comprises a collection of storage blocks tested via the testing process and distinct from other storage blocks in partitions previously made available to the host processing system.

BRIEF DESCRIPTION OF THE DRAWINGS

The following description and associated figures teach the best mode of the invention. For the purpose of teaching inventive principles, some conventional aspects of the best mode may be simplified or omitted. The following claims specify the scope of the invention. Note that some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by the claims and their equivalents.

DETAILED DESCRIPTION

Storage subsystems, such as hard disk drives, solid state drives, and hybrid solid state/hard disk drives, are often used in computing systems to store data objects for a host processing system. These data objects often include audio files, movie files, word documents, spreadsheets, images, or any other type of file. To make a storage subsystem available to the host processing system, the storage subsystem must be communicatively linked to the host processing system to enable communications between the two systems. This communication link may include a Small Computer System Interface (SCSI) bus, a Serial Attached SCSI (SAS) bus, a Serial ATA (SATA) bus, a Peripheral Component Interconnect Express (PCIe) bus, Fibre Channel, or some other similar interface or bus.

As described herein, the storage subsystem that is attached to the host processing system includes storage media that is untested or verified to store data by the manufacturer prior to distribution. Thus, before any operations may be performed, such as storing and reading from the storage subsystem, storage blocks in the storage media must be tested by a processing system. By testing the storage subsystem on the deployed computing system rather than during the manufacturing of the device, time and resources may be saved on a task that could otherwise be performed by the deployed computing system.

In some examples, a storage processing system located on the storage subsystem is used to test or verify the storage blocks in the storage media. Specifically, the storage processing system identifies when the device is initiated or deployed in a computing system, and initiates a testing process of the storage media, wherein the testing process may verify that sectors are available to store data, ensure that portions of the media are not corrupted, or otherwise ensure that the media is available to store data. During the testing, the storage processing system iteratively identifies partition availability events and, based on the events, makes a new partition available to a host processing system. These new partitions correspond to logical block addresses (LBAs) of storage blocks that have completed the testing process, and are available to store data objects for the host processing system.

In at least one example, the host processing system may manage a distributed file system (DFS) that may include any number of storage subsystems and storage partitions. Accordingly, as partitions or grouped LBAs become available via the testing process, the partitions may be added to the distributed file system accessible via the host processing system.

Figure 1:
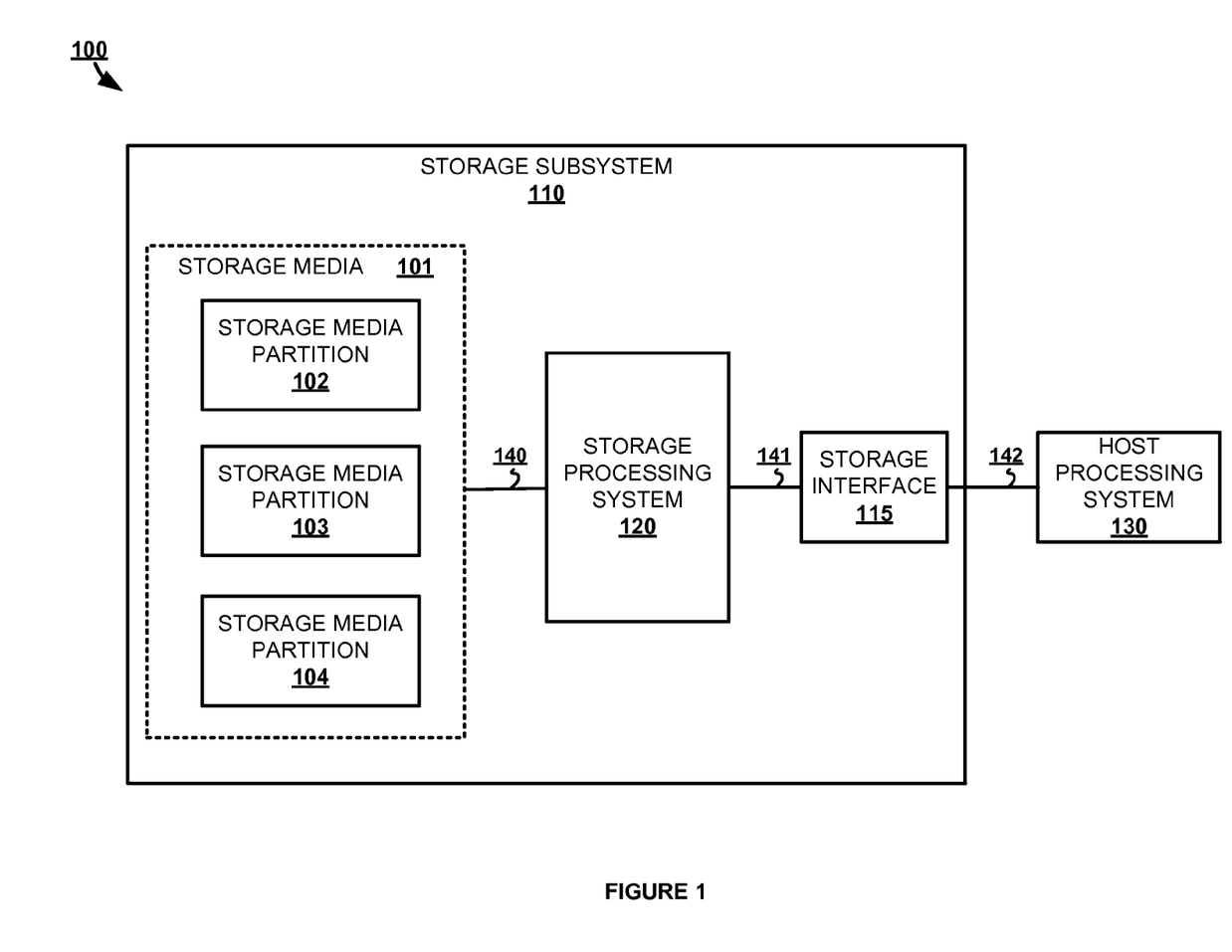
FIG. 1 is a block diagram illustrating a computing system to test storage media upon deployment.

Turning to FIG. 1 as an example, FIG. 1 is a block diagram illustrating a computing system 100 to test storage media upon deployment. Computing system 100 includes storage subsystem 110 and host processing system 130. Storage subsystem 110 further includes storage media 101, storage processing system 120, and storage interface 115. Storage processing system 120 is communicatively coupled to storage media 101 over communication link 140, and is further communicatively coupled to storage interface 115 over communication link 141. Host processing system 130 is communicatively coupled to storage subsystem 110 via storage interface 115 and communication link 142.

In operation, storage subsystems, such as storage subsystem 110, provide storage media to store data objects for host processing system 130. This storage media may include hard disk drive media, solid state drive media, or any other similar type of media, including combinations and improvements thereof. To make storage subsystem 110 available to host processing system 130, the drive is communicatively coupled to host processing system 130, and initiated or deployed within computing system 100. Once initiated, testing is commenced on storage media 101 to provide a plurality of storage media partitions 102-104 to host processing system 130.

In particular, storage media 101 in storage subsystem 110 is untested or unverified to store data by the manufacturer prior to distribution. Accordingly, when deployed within computing system 100, storage blocks within storage media 101 require testing before they can be made available to host processing system 130. This testing may include determining if the storage media includes any bad sectors, determining if data can be written to and read from addresses on the media, or any other similar storage media testing. Once a number of block addresses have been tested on the media, a storage media partition may be provisioned comprising the tested block addresses, and provided to host processing system 130 to store data objects. The determination of when to provision a new partition may include determining when a predefined number of addresses have been tested, determining that a predetermined amount of time has expired since the testing process began, identifying a command to provide a new storage media partition from host processing system 130, or some other similar partition availability event.

Figure 2:
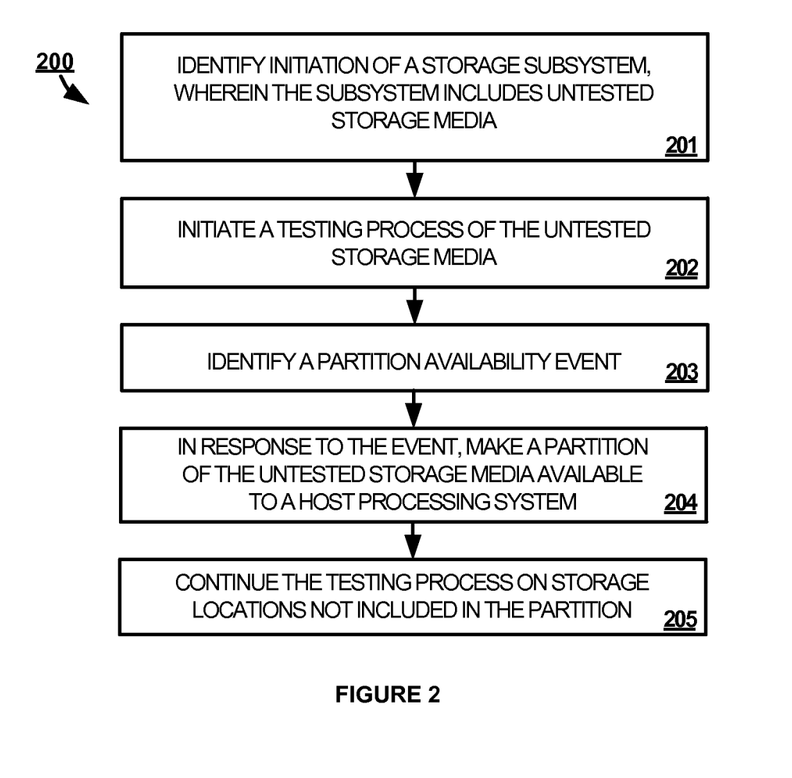
FIG. 2 is a flow diagram illustrating an operation of a storage processing system to test storage media.

To further demonstrate the operation of storage subsystem 110 and storage processing system 120, FIG. 2 is provided. FIG. 2 is a flow diagram illustrating an operation 200 of a storage processing system to test storage media. Operation 200 includes identifying initiation or deployment of storage subsystem 110 in computing system 100, wherein storage subsystem 110 includes storage media that requires testing or verification (201), and initiating a testing process of the storage media (202). This testing may include determining if the storage media includes any bad sectors, determining if data can be written to and read from block addresses on the media, or any other similar storage media testing. As described in FIG. 1, storage subsystem manufacturers may distribute drives with unverified storage sectors, requiring a test process to be executed on locations in the storage subsystem before the storage media can become available. This testing process may ensure that the media does not include errors, that data may be stored at each of the storage locations in the media, or a variety of other tests on each location in the media.

To make the tested storage media available, storage processing system 120 is configured, in operation 200, to identify a partition availability event (203), and responsively make a partition of the storage media available to host processing system 130, wherein the partition comprises storage locations tested via the testing process (204). The partition availability event may include determining when a predefined number of storage blocks have been tested, determining that a predetermined amount of time has expired since the testing process began, identifying a command to provide a new storage media partition from host processing system 130, or some other similar partition availability event. Once a partition is generated and made available to the host, storage processing system 120 continues the testing process on storage locations that are not included in the generated partition (205).

For example, returning to FIG. 1, when storage subsystem 110 is initiated with host processing system 130, storage processing system 120 initiates a testing process on storage media 101. Once a partition event is identified, storage processing system 120 identifies storage locations that have completed testing and provides these locations as storage media partition 102 to host processing system 130. Further, storage processing system 120 continues testing the remaining block addresses in storage media 101 and awaits subsequent partition events to generate storage media partitions 103-104. Once all of the available storage media has been tested, storage processing system 120 halts the testing process.

In some examples, at least one portion of the storage media may be tested and provisioned prior to distributing the storage subsystems. This provisioned portion of the storage media may be used to initiate the storage subsystem upon deployment with the host processing system, and may further initiate the testing process on the storage media. In further instances, the provisioned portion may include a pre-tested partition that is immediately available to the host processing system, while the remaining storage media is tested by the storage processing system.

Figure 3:
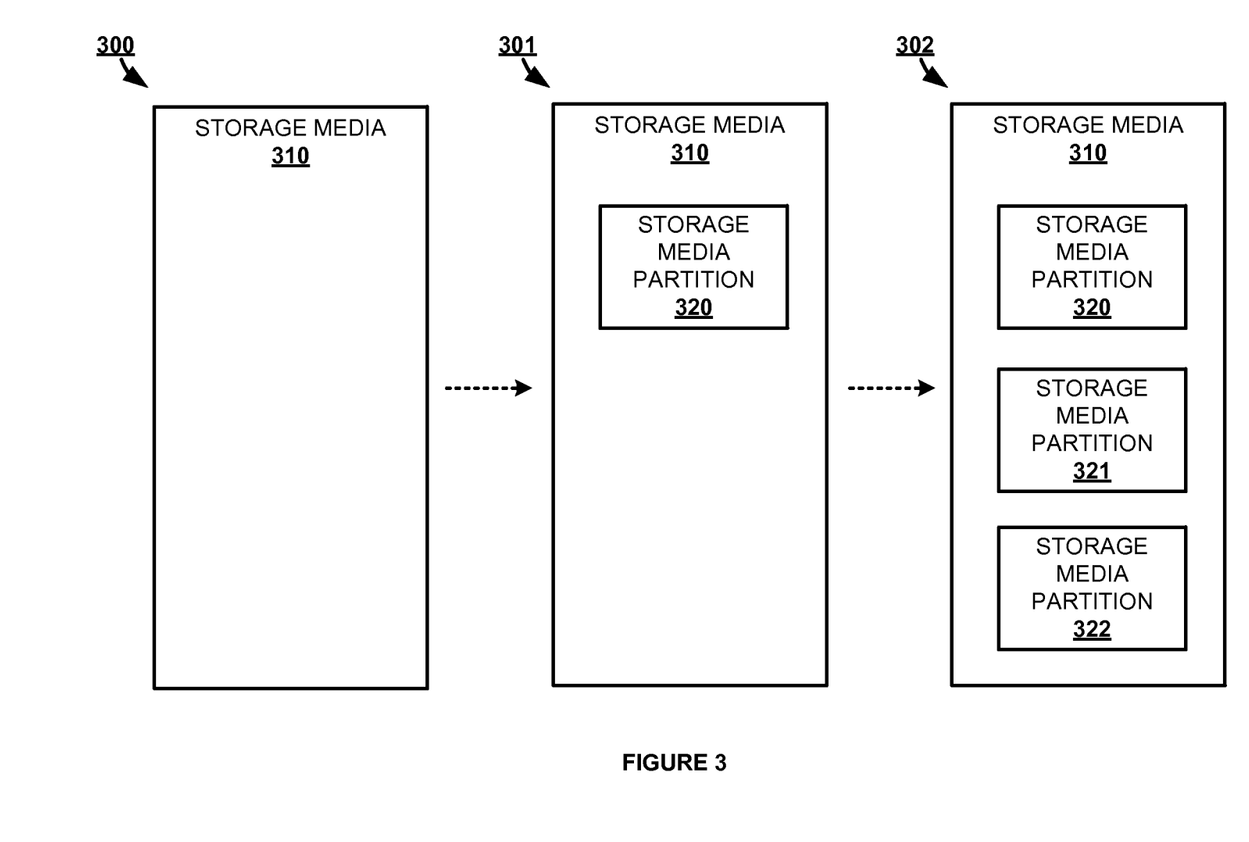
FIG. 3 is a flow diagram illustrating a partitioning of a deployed storage media.

Turning to FIG. 3, FIG. 3 is a flow diagram illustrating a partitioning of a deployed storage media at different time instances 300-302. As depicted at time instance 300, when storage media 310 is deployed and initiated in a computing system, storage subsystem 310 is untested and fails to include any storage media partitions. During a testing process, provided by a storage processing system, storage blocks within the media are tested and made available to a host processing system to store various data objects.

During the testing process, partition availability events may be iteratively identified by the storage processing system indicating a requirement for a new storage media partition. As illustrated in time instance 301, storage media partition 320 is made available to the host processing system in response to identifying a partition availability event. Storage media partition 320 includes block addresses that have been tested and verified using the testing process, and are ready to write and read various data objects. Although a first partition is generated, the testing process continues to test storage locations within storage media 310 until the entirety of the storage media has been tested and all of the valid storage blocks have been determined.

Accordingly, as illustrated at time instance 302, storage media partitions 321-322 are generated within storage media 310. These storage media partitions occur as a result of subsequent partition availability events and include storage locations separate and distinct from the locations of storage media partition 320. Although not illustrated in the present instance, in some examples, the storage processing system may test storage media locations until all storage locations have been verified. Once verified, the test process may be halted, and all tested storage locations made available to the host processing system.

Figure 4:
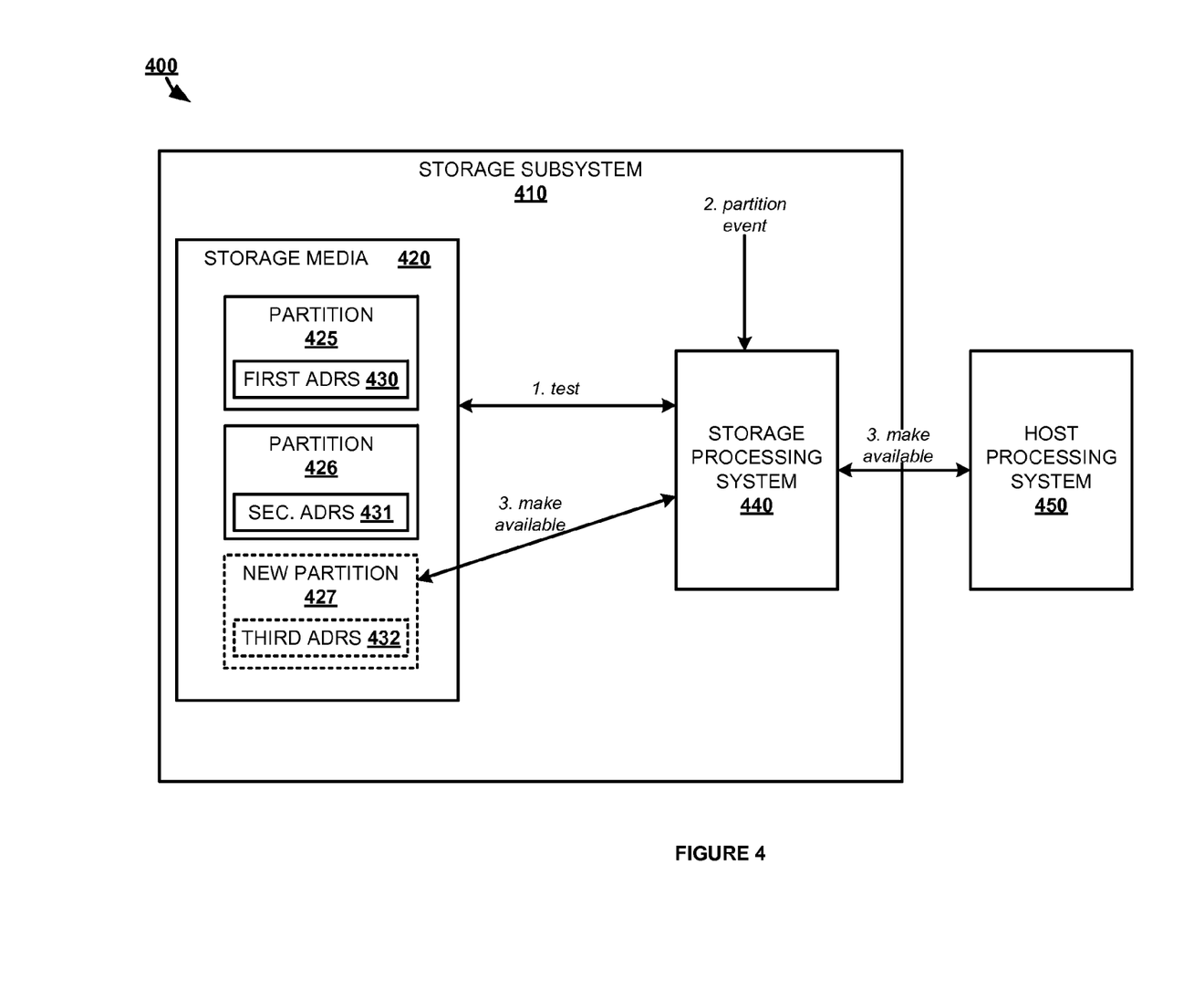
FIG. 4 is a block diagram illustrating an overview of providing new storage partitions to a host processing system.

Referring now to FIG. 4, FIG. 4 is a block diagram illustrating an overview 400 of providing new storage partitions to a host processing system. Overview 400 includes storage subsystem 410 and host processing system 450. Overview 400 is an example of a process that may be completed in any serving computing system, desktop computing system, or any other end computing system. Storage subsystem 410 further includes storage media 420 and storage processing system 440. Storage processing system 440 may comprise any processing system capable of testing and providing storage media partitions to host processing system 450.

As illustrated, storage processing system 440 identifies an initiation of storage subsystem 410 with host processing system 450. This initiation may occur when storage subsystem 410 is communicatively coupled to host processing system 450, when storage subsystem 410 is provided power within the computing system with host processing system 450, or any other deployment instance in the computing system. Upon initiation, storage processing system 440 initiates testing on the various storage locations within storage media 420. As described previously, a manufacturer may prefer to distribute storage subsystems or drives without testing the drives prior to distribution. This eliminates wasted operations by the manufacturer that could otherwise be accomplished upon distribution and deployment in an end computing system.

As the tests are carried out on storage media 420, storage processing system 440 may identify a partitioning event that requests a new partition for host processing system 450. This partitioning event may occur when a predefined number of storage locations have completed testing, may occur at the expiration of a predefined testing time period, may occur when host processing system 450 requests a new partition, or may occur at any other instance. For example, storage processing system 440 may be configured to provide a new partition to host processing system 450 for every terabyte of new storage locations. Accordingly, when storage processing system 440 identifies that a new terabyte of storage locations have been tested, storage processing system 440 may provide the new locations to host processing system 450 as a new partition.

In the present instance, storage media 420 already includes partitions 425-426, each with block addresses 430-431. However, the test process executed by storage processing system 440 may continue until the entirety of storage media 420 has been tested. Thus, upon identifying a partition event, storage processing system 440 determines that third addresses 432 are available and generates new partition 427 that includes third addresses 432. Once generated, new partition 427 may be provided to host processing system 450 via storage processing system 440, allowing host processing system 450 to store and retrieve a plurality of data objects.

In at least one instance, host processing system 450 may manage a DFS that uses a plurality of drives, partitions, and other computing systems to provide a single file system view to an end user. Accordingly, host processing system 450 may not require a single partition, but can add new partitions to the storage stack used in the file system. Using this process, any number of drives or storage subsystems may be tested and made available to host processing system 450 using the methods described herein.

Figure 5:
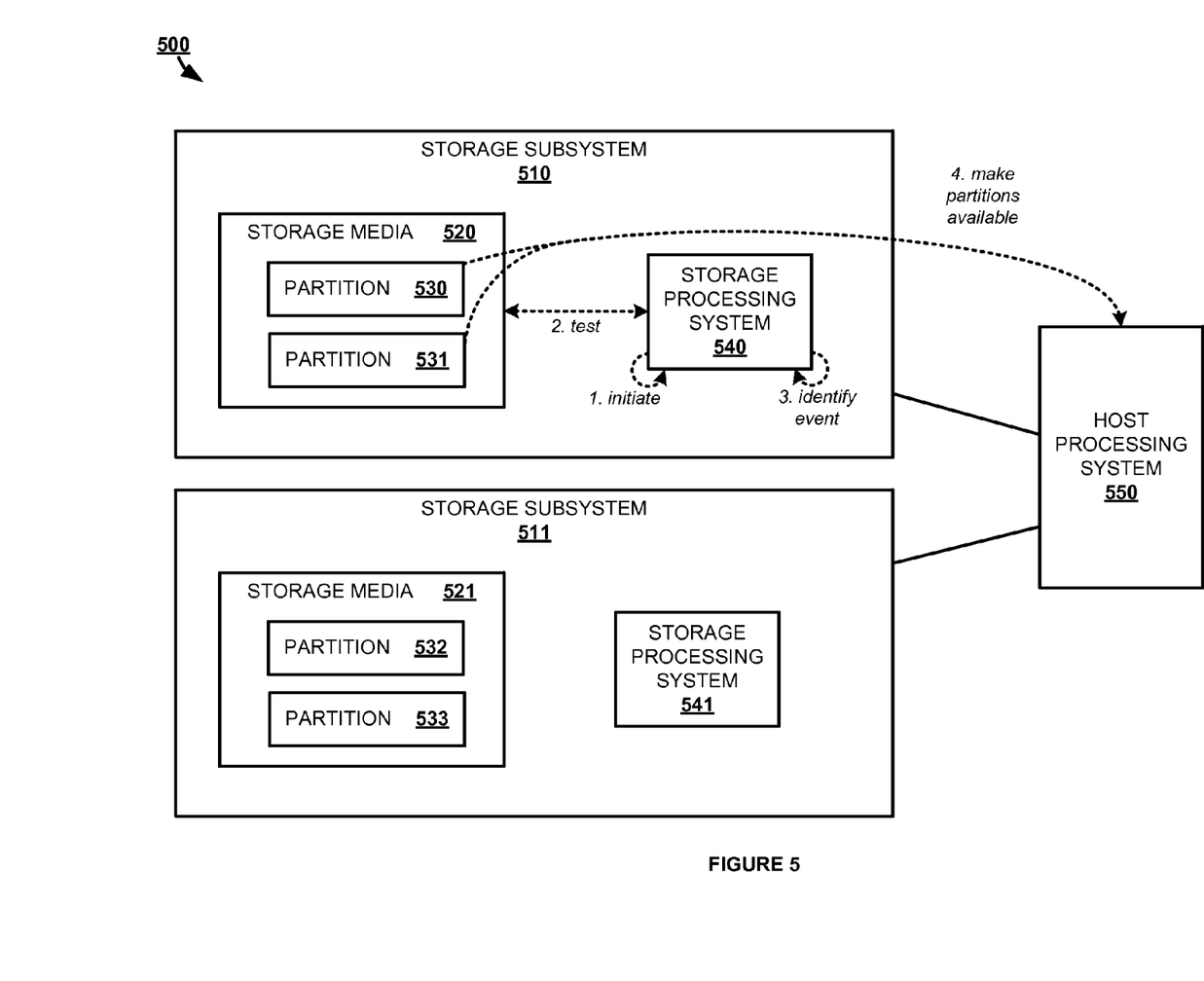
FIG. 5 is a block diagram illustrating an overview of adding an storage subsystem to a computing environment.

To further illustrate the deployment of multiple storage subsystems, FIG. 5 is provided. FIG. 5 is a block diagram illustrating an overview 500 of adding an untested storage subsystem to a computing environment. Overview 500 includes storage subsystems 510-511 and host processing system 550. Storage subsystems 510-511 further includes storage media 520-521 and storage processing systems 540-541.

As illustrated in the present example, storage subsystem 511 is currently available to host processing system 550. Thus, host processing system 550 may read, write, and delete various data objects from partitions 532-533 within storage media 521. However, as further storage space is required, storage subsystem 510 may be initiated within the computing system to provide additional storage media to host processing system 550. Upon initiation or deployment of storage subsystem 510, which may comprise communicatively coupling and powering storage subsystem 510, storage processing system 540 initiates testing of storage blocks in storage media 520. This testing may include determining if the storage media includes any bad sectors, determining if data can be written to and read from addresses on the media, or any other storage media testing.

During the testing of storage media 520, storage processing system 540 identifies a partitioning event that is used to generate a new partition within storage media 520. This partitioning event may be generated by storage processing system 540, or may be generated by host processing system 550. For example, storage processing system 540 may include a predefined storage block threshold that, upon reaching the threshold, triggers the generation of a new partition. In contrast, storage processing system 540 may notify host processing system 550 that tests are being executed on storage media 520 to make new storage media available. Based on this notification, host processing system 550 may notify storage processing system 540 when a new partition is required.

Upon identifying a first partitioning event, storage processing system 540 may generate storage partition 530 and provide the new partition to host processing system 550, while continuing the testing process on further storage locations. In response to identifying a second partitioning event, storage processing system 540 may generate second storage partition 531 and provide the partition to host processing system 550. This process of testing and identifying the partitioning events may repeat as many times as necessary until the entirety of storage media 520 is tested. In some examples, the last partitioning event may occur when the entire storage media has been tested and is ready to be provided to the host processing system.

As described herein, in some examples, host processing system 550 may be used to manage a DFS that allows data objects to be stored using a plurality of storage subsystems and partitions. Accordingly, when host processing system 550 requires additional storage, an administrator may communicatively couple new untested storage media in the form of storage subsystem 510. This untested storage media may include solid state storage media, hard disk storage media, or any other similar storage media, including improvements thereof. Once coupled and initiated within the computing system, storage processing system 540 may initiate a testing process that is used to test and verify the plurality of storage locations within storage media 520, and provide the tested portions of storage media 520 as partitions 530-531 to host processing system 550.

Although illustrated in the previous example as supplying partitions to a DFS, it should be understood that the partitions might be supplied to a computing system to provide any type of storage system. For example, host processing system 550 may simply require new storage partitions to store additional data for processes executing on host processing system 550. Further, although illustrated with two storage subsystems in the present example, it should be understood that any number of storage subsystems or devices might be included in the computing system to provide adequate storage media.

In some examples, the storage subsystems distributed from the manufacturer may include different amounts of available storage. For example, storage subsystem 510 may include 2.2 terabytes of available storage, whereas storage subsystem 511 may include 1.9 terabytes of available storage. Although each subsystem or drive may include differing amounts of storage, the manufacturer may sell the drives based on the average yield of each of the drives. Using the previous example, the manufacturer may sell the drives as yielding an average of at least 2 terabytes of storage capacity. Accordingly, although some drives may not contain 2 terabytes of storage space, as more drives are deployed, the average should provide the user with the requisite storage per drive.

Figure 6:
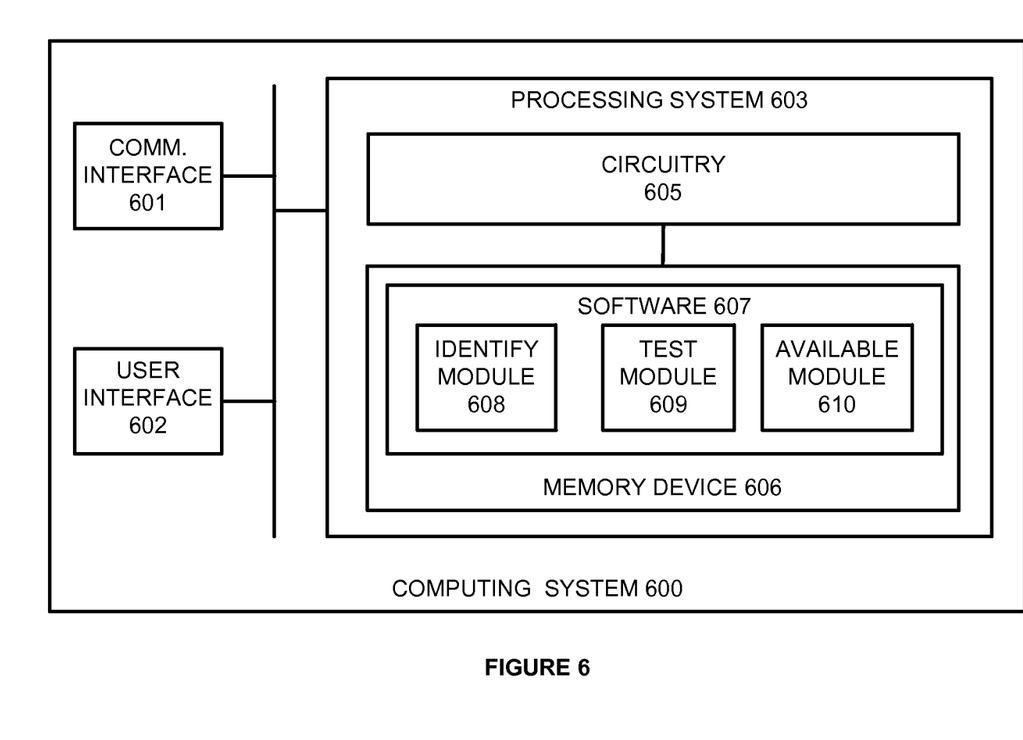
FIG. 6 is a block diagram illustrating a computing system to test a new storage subsystem upon deployment.

FIG. 6 is a block diagram illustrating a computing system 600 to test new storage subsystems and make them available to store data objects. Computing system 600 is representative of a computing system that may be employed in any computing apparatus, system, or device, or collections thereof, to suitably implement the storage processing systems described herein in FIGS. 1-5. Computing system 600 comprises communication interface 601, user interface 602, and processing system 603. Processing system 603 is communicatively linked to communication interface 601 and user interface 602. Processing system 603 includes processing circuitry 605 and memory device 606 that stores operating software 607.

Communication interface 601 comprises components that communicate over communication links, such as network cards, ports, RF transceivers, processing circuitry and software, or some other communication devices. Communication interface 601 may be configured to communicate over metallic, wireless, or optical links. Communication interface 601 may be configured to use time division multiplexing (TDM), internet protocol (IP), Ethernet, optical networking, wireless protocols, communication signaling, SAS, SATA, Fiber Channel, or some other communication format—including combinations thereof. In particular, communication interface 601 may be communicatively coupled to storage media, such as hard disk media and solid state media. Further, in some instances, communication interface 601 may be configured to communicate with a main processing system of a computing device. This main processing system may execute various applications, operating systems, and processes for an end user, but offload at least a portion of the storage processes to computing system 600.

User interface 602 comprises components that interact with a user. User interface 602 may include a keyboard, display screen, mouse, touch pad, or some other user input/output apparatus. User interface 602 may be omitted in some examples.

Processing circuitry 605 comprises microprocessor and other circuitry that retrieves and executes operating software 607 from memory device 606. Memory device 606 comprises a non-transitory storage medium, such as a disk drive, flash drive, data storage circuitry, or some other memory apparatus. Operating software 607 comprises computer programs, firmware, or some other form of machine-readable processing instructions. Operating software 607 includes identify module 608, test module 609, and available module 610, although any number of software modules may provide the same operation. Operating software 607 may further include an operating system, utilities, drivers, network interfaces, applications, or some other type of software. When executed by circuitry 605, operating software 607 directs processing system 603 to operate computing system 600 as described herein.

In particular, identify module 608 is configured to, when executed by computing system 600 and processing system 603, to identify when a storage subsystem is initiated or deployed within a computing system or environment. In some examples, computing system 600 may reside on the storage subsystem, although it should be understood that it might also reside as a processing system external to the storage subsystem. Once the storage subsystem is deployed, test module 609 initiates a testing process on untested portions of storage media on the storage subsystem. In some examples, a manufacturer may distribute storage subsystems or drives to end devices without testing the storage media contained therein. Accordingly, before the drive can be used for the storage of various data objects, storage blocks within the storage media must be tested and verified before they can become available.

During the testing of the storage locations, available module 610 is configured to identify a partition availability event and, responsive to the event, generate a partition for a host processing system that includes storage locations in the storage media tested via the testing process. This partition availability event may comprise a predefined number of storage locations being tested or verified via the testing process, a predefined amount of time for executing the testing process, an external request for a partition to be made available to a host, or any other partition availability event. Once the partition is generated using available module 610, the partition is then provided to the host processing system, allowing the host processing system to store, read, and delete data from the partition. Meanwhile, test module 609 will continue to test the untested storage blocks of the storage media to verify new storage locations for additional storage partitions. Thus, when a second availability event occurs, a new partition may be made available to the host processing system that includes the newly tested storage blocks.

In at least one example, the storage subsystems may be deployed within a DFS computing environment or system. Thus, although partitions may be generated via the storage processing system, host processing system may, using software, present a unified file system view that includes a plurality of storage subsystems and partitions. Further, because a DFS is able to manage a plurality of storage devices and partitions, partitions may be added to the file system as they are tested and verified upon deployment.

Returning to the elements of FIG. 1, storage subsystem 110 may comprise a hard disk drive, a solid state drive, or any other similar storage apparatus. Storage processing system 120 may comprise various processing elements, memory elements, and interface elements capable of testing storage media and providing the tested storage media as partitions to host processing system 130. Storage interface 115 may comprise any interface capable of interfacing with host processing system 130 and may comprise one or more integrated circuits and processing elements. Host processing system 130 may comprise one or more processing elements, memory devices, interfaces, and other computing elements capable of executing processes that require data storage using storage subsystem 110.

Communication links 140-142 each use metal, glass, optical, air, space, or some other material as the transport media. Communication links 140-141 may each use time Division Multiplex (TDM), asynchronous transfer mode (ATM), communication signaling, or any other form of communication available within a storage subsystem. Communication link 142 may use Small Computer System Interface (SCSI), Serial Attached SCSI (SAS), Serial ATA (SATA), Peripheral Component Interconnect Express (PCIe), Fibre Channel, or some other similar interface or bus.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A computer apparatus to test a storage subsystem that comprises storage media, the computer apparatus comprising:
   one or more non-transitory computer readable media; and
   processing instructions stored on the one or more non-transitory computer readable media that, when executed by a processing system of the storage subsystem, direct the processing system to:
      in response to a deployment of the storage subsystem, initiate a testing process to identify storage blocks in the storage media suitable for storing data for a host processing system, wherein:
         the storage blocks are capable of being written to and read from by the host processing system,
         the testing process identifies at least bad sectors in the storage media, and
         the deployment comprises communicatively coupling the processing system of the storage subsystem with the host processing system via a communication bus and providing power to the storage subsystem;
      after initiating the testing process, iteratively identify partition availability events; and
      in response to each partition availability event in the partition availability events, make a partition of the storage media available to the host processing system, wherein the partition comprises a collection of storage blocks identified via the testing process as suitable for storing data for the host processing system that are distinct from other storage blocks in partitions previously made available to the host processing system.

2. The computer apparatus of claim 1 wherein the storage subsystem comprises a solid state drive.

3. The computer apparatus of claim 1 wherein the storage subsystem comprises a hard disk drive.

4. The computer apparatus of claim 1 wherein iteratively identifying partition availability events comprises iteratively identifying in response to the host processing system requesting a Previously Presented partition.

5. The computer apparatus of claim 1 wherein iteratively identifying partition availability events comprises iteratively identifying that a predetermined number of the storage blocks have been identified via the testing process as suitable for storing data for the host processing system.

6. The computer apparatus of claim 1 wherein iteratively identifying partition availability events comprises iteratively identifying that the testing process has executed for a predefined period.

7. The computer apparatus of claim 1 wherein iteratively identifying partition availability events comprises identifying a last partition availability event corresponding to the testing process having completed identification of storage blocks.

8. The computer apparatus of claim 1 wherein:
   the storage subsystem includes at least one tested partition of storage media; and
   the processing instructions further direct the processing system to, in response to the deployment of the storage subsystem, make the at least one tested partition of storage media available to the host processing system.

9. A storage subsystem to test storage media upon deployment, the storage subsystem comprising:
   storage media; and
   a storage processing system configured to:
      in response to a deployment of the storage subsystem in a computing system with a host processing system, initiate a testing process to identify storage blocks in the storage media suitable for storing data for the host processing system, wherein:
         the storage blocks are capable of being written to and read from by the host processing system,
         the testing process identifies at least bad sectors in the storage media, and
         the deployment comprises at least communicatively coupling the storage processing system with the host processing system via a communication bus and providing power to the storage subsystem;

after initiating the testing process, iteratively identify partition availability events; and in response to each partition availability event in the partition availability events, make a partition of the storage media available to the host processing system, wherein the partition comprises a collection of storage blocks identified via the testing process as suitable for storing data for the host processing system that are distinct from other storage blocks in partitions previously made available to the host processing system.

10. The storage subsystem of claim 9 wherein the storage media comprises solid state storage media.

11. The storage subsystem of claim 9 wherein the storage media comprises hard disk storage media.

12. The storage subsystem of claim 9 wherein iteratively identifying partition availability events comprises iteratively identifying that a predetermined number of the storage blocks have been identified via the testing process as suitable for storing data for the host processing system.

13. The storage subsystem of claim 9 wherein iteratively identifying partition availability events comprises iteratively identifying that the testing process has executed for a predefined period.

14. The storage subsystem of claim 9 wherein iteratively identifying partition availability events comprises iteratively identifying in response to the host processing system requesting a new partition.

15. The storage subsystem of claim 9 wherein iteratively identifying partition availability events comprises identifying a last partition availability event corresponding to the testing process having completed identification of storage blocks.

16. The storage subsystem of claim 9 wherein:
the storage subsystem includes at least one tested partition of storage media; and
the storage processing system is further configured to, in response to the deployment of the storage subsystem, make the at least one tested partition of storage media available to the host processing system.

17. A computing system comprising:
a host processing system communicatively coupled to a storage subsystem for deployment via a communication bus; and
the storage subsystem comprising storage media and a storage processing system, wherein the storage processing system is configured to:
in response to a deployment of the storage subsystem in the computing system, initiate a testing process to identify storage blocks in the storage media suitable for storing data for the host processing system, wherein:
the storage blocks are capable of being written to and read from by the host processing system,
the testing process identifies at least bad sectors in the storage media, and
the deployment comprises at least communicatively coupling the storage processing system with the host processing system;
after initiating the testing process, iteratively identify partition availability events; and
in response to each partition availability event in the partition availability events, make a partition of the storage media available to the host processing system, wherein the partition comprises a collection of storage blocks identified via the testing process as suitable for storing data for the host processing system that are distinct from other storage blocks in partitions previously made available to the host processing system.

18. The computing system of claim 17 wherein iteratively identifying partition availability events comprises iteratively identifying that a predetermined number of the storage blocks have been identified via the testing process as suitable for storing data for the host processing system.

19. The computing system of claim 17 wherein the host processing system is configured to, in response to each partition of the storage media being made available, add the partition to a distributed file system.

20. The computing system of claim 19 wherein the host processing system is further configured to initiate storage of at least one data object to each partition made available from the storage subsystem.

* * * * *